United States Patent [19]

Marshall

[11] Patent Number: 4,704,090
[45] Date of Patent: Nov. 3, 1987

[54] MOUNTING PANEL FOR A LAMP SOCKET ASSEMBLY

[75] Inventor: James E. Marshall, Grosse Pointe Park, Mich.

[73] Assignee: Ford Motor Company, Dearborn, Mich.

[21] Appl. No.: 1,598

[22] Filed: Jan. 8, 1987

[51] Int. Cl.$^4$ ............................................. H01R 9/09
[52] U.S. Cl. ...................................... 439/56; 439/554
[58] Field of Search .................. 339/17 D, 17 C, 17 F, 339/127, 128

[56] References Cited

U.S. PATENT DOCUMENTS

| | | | |
|---|---|---|---|
| 2,803,000 | 12/1953 | Johanson | 339/258 |
| 2,884,609 | 9/1956 | Fraser et al. | 339/17 |
| 2,936,437 | 9/1956 | Fraser et al. | 339/17 |
| 3,050,705 | 8/1962 | Benson | 339/17 |
| 3,253,249 | 5/1966 | Hess et al. | 339/127 |
| 3,699,495 | 10/1972 | Raynor | 339/17 C |
| 3,909,096 | 9/1975 | Brzozowski | 339/17 D |
| 4,181,390 | 1/1980 | Aizawa | 339/65 |
| 4,227,760 | 10/1980 | Witek, Jr. | 339/14 R |
| 4,445,164 | 4/1984 | Giles, III et al. | 339/17 D |
| 4,468,585 | 8/1984 | Beyland et al. | 339/17 D |
| 4,571,016 | 2/1986 | Debrabander | 339/17 D |

FOREIGN PATENT DOCUMENTS 1454509 5/1973 United Kingdom ............. 339/17 D
2025162 7/1979 United Kingdom .

Primary Examiner—Neil Abrams
Attorney, Agent, or Firm—Paul K. Godwin, Jr.; Clifford L. Sadler

[57] ABSTRACT

A support panel containing an aperture for mounting a lamp socket assembly that is linearly insertable into the aperture to contact an intermediate flexible printed circuit layer when oriented in a first rotational position about its axial length, wherein the aperture is formed to capture and releasably retain the socket assembly when so inserted and to allow the socket assembly to pass through the aperture when oriented in a second rotational position.

5 Claims, 10 Drawing Figures

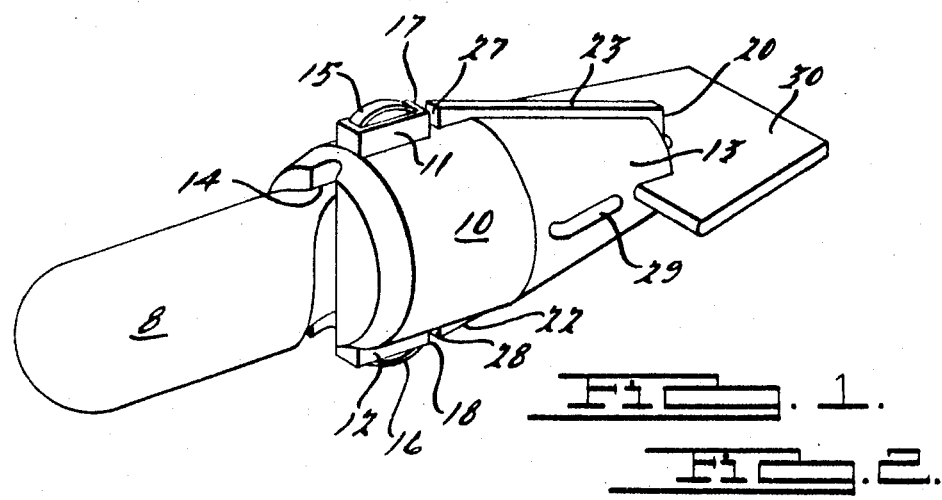
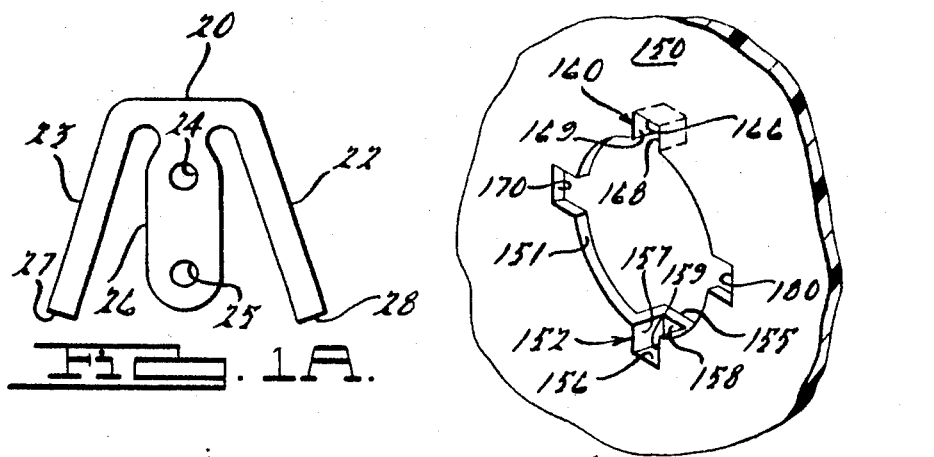
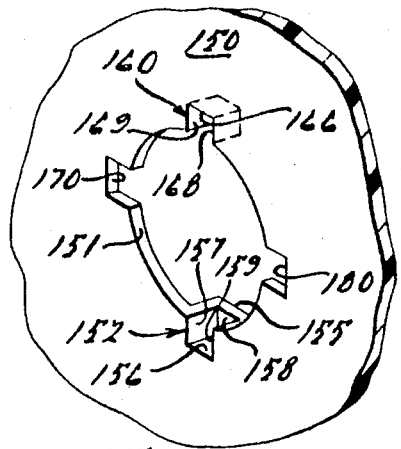
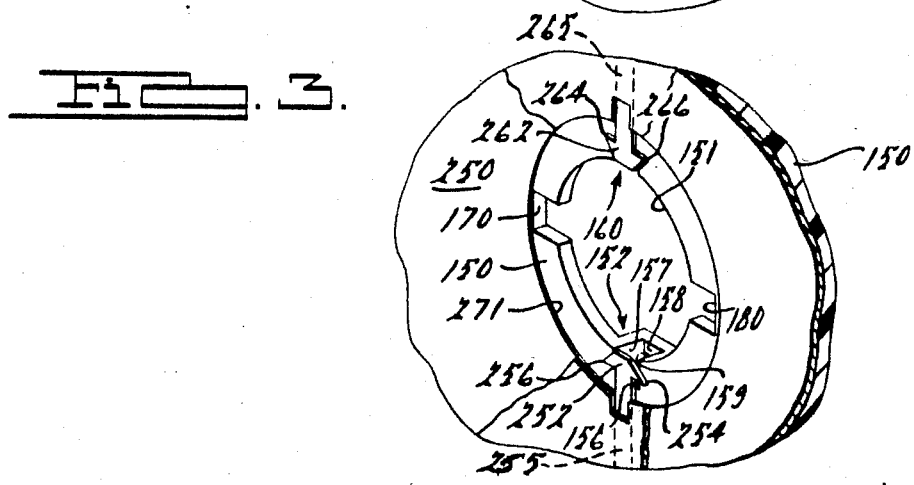

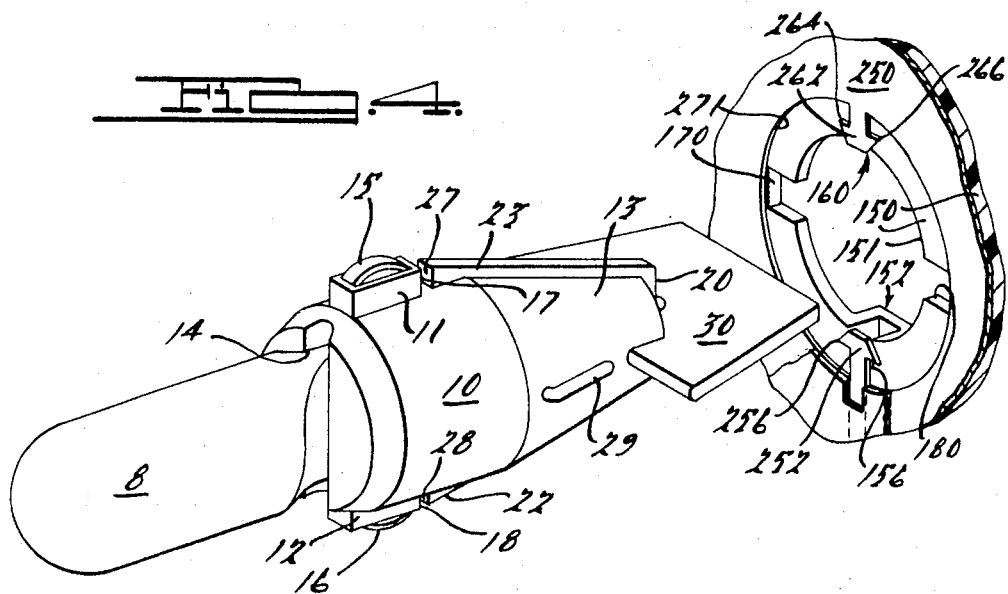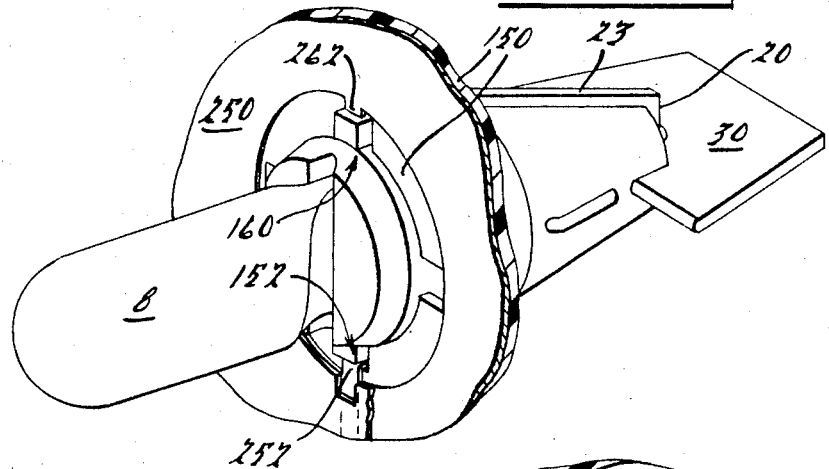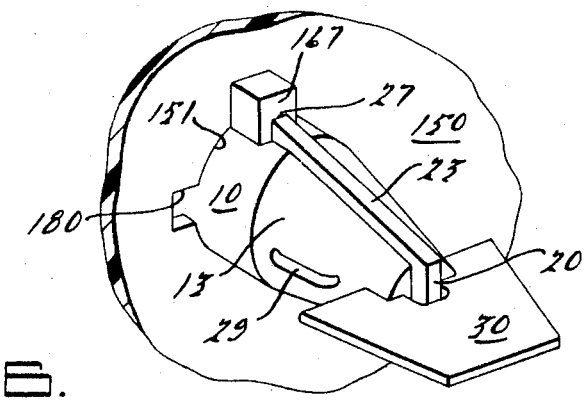

MOUNTING PANEL FOR A LAMP SOCKET ASSEMBLY

BACKGROUND OF THE INVENTION

1. Field of the Invention

The prsent invention is directed to the field of wedge base lamp sockets and more particularly to the area of an improved socket assembly and corresponding panel mounting aperture.

2. Description of the Prior Art

It is commonplace to find wedge base electric lamps used for illumination of display panels such as in the instrument panels of automotive vehicles. The socket assemblies use to support the relaceable lamps are, for the most part, insertable into an aperture of a rigid support panel containing an overlay of a flexible printed circuit layer with exposed portions of electrical conductors adjacent the aperture so that the corresponding electrical contacts on the socket assembly will be compressibly mated when the socket is properly inserted into the aperture and latched therein.

U.S. Pat. Nos. 3,909,096 and 4,227,760 illustrate typical socket assemblies which are utilized in conjunction with flexible printed circuit layers. In each case, the sockets are inserted through aligned apertures in the printed circuit layer and the rigid support panel. Latching is achieved by rotating the socket assembly a prescribed amount after it is fully inserted so that locking shoulders extending from the forward portion of the socket assembly will latch to the opposite surface of the rigid support panel. Open notches are included in the periphery of the panel aperture in order to allow the locking shoulders to pass during insertion and prior to latching rotation.

British Patent Specification No. 1,454,509 illustrates a common type of socket assembly that is ideally suited for automated assembly since the socket is inserted into the aperture of the rigid panel and is latched therein without further rotation of the socket. That device employs a flexible printed circuit layer having exposed conductor portions which extend over the aperture formed in the support panel so that insertion of the lamp socket causes the exposed conductors to be wiped down into and against the internal sidewalls of the aperture. Electrical contacts of the socket are biased outwardly and compress the electrical conductors against the aperture sidewalls to maintain electrical contact. Removal of the socket device is achieved by pushing or pulling the socket in the reverse direction of its insertion so as to overcome the friction fit of the conductors and adjacent resilient members.

In each of the prior art examples cited above, the flexible printed circuit layer is located on the same side of the rigid support panel as the lamp socket assembly is inserted into the panel aperture. Likewise, removal of the socket assembly is achieved by gaining access to the same side of the rigid panel in which the flexible printed circuit layer is located in order to release the locking mechanism and withdraw the assembly. As a result, when rear panel access is desired to allow removal of the lamp socket assembly, the flexible printed circuit layer must also be located on the rear surface of the rigid support panel.

SUMMARY OF THE INVENTION

During an investigation of automatic assembly methods for illuminated instrument panels, it was determined that very efficient way of achieving such assembly was to utilize the rigid support panel (housing for the instrument panel) in a single orientation in order to layer and install all components from a single side of the panel. The components layered and installed into that housing including the flexible printed circuit layer, the lamp socket assemblies, the instrument interconnectors and the instruments prior to being sealed with a transparent lens assembly. However, it was discovered that prior art wedge base socket assemblies would not allow for subsequent service replacement from the rear of the rigid suport panel housing if they were originally inserted from the front, with the lamps oriented towards the front.. The present invention derived from the necessary objective of allowing for front panel insertion and rear removal of a lamp socket assembly in a rigid panel aperture.

The described invention includes an insertable lamp bulb socket assembly that provides electrical connection between a flexible printed circuit conductor overlaying an insertion aperture formed in a rigid panel and the electrical leads of a light emitting lamp mounted in the assembly. The socket assembly includes a cylindrical body portion having a defined axial length, a first open end portion for receiving the lamp, a second tapered end portion opposite the first end and an intermediate portion between the first and second end portions. A locking means is mounted on the body and has a first resilient arm extending from the second end portion of the body towards the intermediate portion. The arm has a first end portion that is normally biased to overlap the aperture in the rigid panel when the assembly is inserted therein. A means is also included on the intermediate portion which extends outwardly therefrom to overlap the aperture and for limiting the axial insertion of the assembly into the aperture. Means are also included within the intermediate portion for making electrical contact with the exposed conductors of the flexible printed circuit layer overlaying the insertion aperture.

The invention also includes a rigid support panel assembly that has a defined first surface onto which a flexible printed circuit panel is mounted and a second surface which is substantially parallel to the first. The panel contains at least one aperture formed to receive the lamp socket assembly axially inserted from the first surface side of the panel. The aperture is formed to interact with the lamp socket assembly to releasably retain the socket assembly against axial removal in either direction when the lamp is inserted in a first rotational configuration and formed to allow the lamp socket assembly to pass through unobstructed when it is oriented in a second rotational configuration that is angularly rotated to be offset with respect to the first configuration. The aperture includes a plurality of notches spaced about the periphery of the aperture. wherein at least one of the notches is open to the first surface side of the panel and closed to the second side to limit the insertion of the socket assembly when in the first rotational configuration and at least a like number of notches are open to both the first and second surface sides of the panel.

In the described embodiment, first and second pairs of diametrically opposed notches are equally spaced about the periphery of the opening. The first pair of notches are open to the first surface side of the panel so as to allow the overlaying exposed conductors to be wiped into and against the internal sidewalls of those first pair of notches when the lamp socket is inserted therein. The first pair of notches are closed with respect to the second surface of the panel and provide a recessed stop surface that interacts with the limiting means on the lamp socket assembly to limit the insertion of the lamp socket assembly to a predetermined position. The second pair of notches are open to both the first and second surfaces of the panel and allow unobstructed passing of the lamp assembly when the socket assembly is rotated so that the limiting means is aligned with each of the second pairs of notches.

The object of the present invention is provide a lamp socket support panel and lamp socket assembly which together allow for efficient automated assembly of illuminated panels while providing desired service access.

It is another object of the present invention to provide a lamp socket assembly and support panel in which the socket assembly may be inserted and latched into an aperture of the panel by a uni-directional insertion movement of the socket assembly from one side of the panel aperture and allow for removal of the socket assembly from the opposite side of the panel.

BRIEF DESCRIPTION OF THE DRAWINGS

FIG. 1 is perspective view of the wedge base lamp socket assembly of the present invention.

FIG. 1A is a plan view of the resilient arm element employed in the present invention.

FIG. 2 is a perspective view of the front surface of the rigid support panel aperture employed in the present invention.

FIG. 3 is a perspective view of the front surface of the rigid support panel overlayed with the flexible printed circuit layer employed in the present invention.

FIG. 4 is a perspective view of the lamp socket assembly properly oriented for axial insertion through the front side of the aperture of the rigid support panel.

FIG. 5 is a perspective view of the lamp socket assembly inserted into the aperture of the rigid support panel.

FIG. 6 is a perspective rear view of the rigid support panel and the inserted lamp socket assembly.

DETAILED DESCRIPITON OF THE PREFERRED EMBODIMENT

Figure 7:
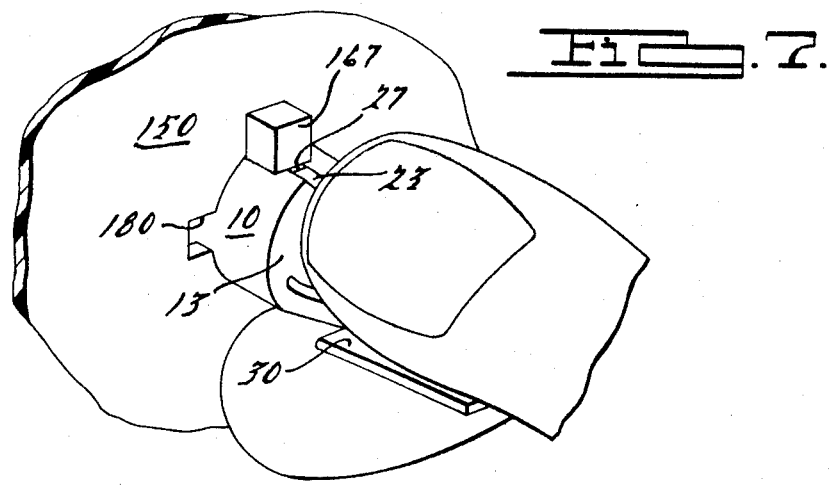
FIG. 7 illustrates the first step in manual removal of the lamp socket assembly from the rear of the rigid support panel.

The lamp plug assembly of the present invention is shown in FIG. 1 as having a main body formed of an insulative material, being of generally cylindrical shape and having a defined axis along its length. A first open end 14 of the main body is shown as containing a wedge base lamp 8, fully inserted therein. An intermediate portion 10 of the body is adjacent the first open end 14 and supports a pair of lugs 11 and 12. The lugs 11 and 12 respectively contain outwardly biased electrical contacts 15 and 16, which are internally connected to clamping contacts of a conventional type for providing mechanical and electrical connection to the wedge base and filament leads of the lamp 8. (The internal connections to the wedge base lamp are conventional in nature and are not shown or claimed as part of this invention.) The body of the bulb socket assembly contains a second end portion 13 which is somewhat tapered from the intermediate portion 10 to serve as a guide when the lamp socket assembly is inserted into its panel aperture. A tab means 30 is connected to the second end portion 13 and provides a manual gripping surface for the lamp socket assembly. A locking means 20 extends from the second end portion 13 back towards lugs 11 and 12 on the intermediate portion 10 of body. The locking means contains a pair of resilient arms 22 and 23 and the arms contain respective ends 27 and 28 that are spaced apart but opposed to the end surfaces 17 and 18 of the lugs 11 and 12. The end surfaces 17 and 18 of the lugs 11 and 12 serve to limit the amount of insertion of the plug assembly into the aperture of the panel, described later. The end surfaces 27 and 28 of the locking means 20 provide retrorse retention of the assembly after it is fully inserted into the panel aperture.

FIG. 1A shows a detail plan view on the locking means 20 which, in this case, is formed as a unitary element of a relatively resilient material such as nylon. The locking means 20 has a support tab 26 centrally located with a pair of mounting apertures 24 and 25. A slot is formed in the second end portion 13 of the lamp plug assembly body and somewhat overlaps into the intermediate portion 10. A retaining pin 29 is inserted through the second end portion 13 so as to extend through apertures 24 and 25 of the locking means 20 and secure it in place.

The "front" side of a rigid support panel 150 is shown in FIG. 2. The support panel contains an aperture 151 into which the lamp socket assembly is intended to be mounted and retained so that the lamp 8 will be interconnected to an electrical power supply and provide illumination on the front side of the panel 150. The aperture 151 is generally circular in configuration, is slightly larger than the intermediate portion 10 of the socket assembly body, but small enough to prevent passage of the lugs 11 and 12.

A pair of notches 152 and 160 are diametrically opposed and are intended to receive the lugs 11 and 12 when the socket assembly is inserted into the aperture from the front side. The notches 152 and 160 are open to the front surface and contain recessed stop surface 158 and 168. Sidewalls 156, 157 and 159 provide a guideway to the stop surface 158 in notch 152. Likewise, sidewalls 166, 167 and 169 provide a guideway to the stop surface 168 in notch 160.

A second pair of diametrically opposed notches 170 and 180 are formed in the panel 150 and are open at both the front and rear surfaces of the panel. The notches 170 and 180 are equally spaced from notches 152 and 160 and are sufficiently large enought to pass the lugs 11 and 12 when the lamp plug assembly is rotated so that the lugs are aligned therewith.

FIG. 3 illustrates the use of a flexible printed circuit layer 250 overlaying the front surface of the rigid support panel 150. The flexible printed circuit layer 250 is shown with an aperture 271 formed therein and positioned to be coincident with the aperture 151. Electrical conductors 255 and 265 are showing having respective exposed portions 252 and 262 overlaying the notches 152 and 160. In this case, the exposed conductors 252 and 262 are cut to form barbed edges 254/256 and 264/266 that are wider than the width of the notches 152 and 160. Therefore, when the lamp socket assembly is inserted into the aperture 151 of the rigid panel 150, the lugs 11 and 12 will wipe the exposed electrical conductors 252 and 262 into the closed notches and the barbed edges will act as retrorse retainers to hold the exposed conductors in place even if the lamp plug assembly is subsequently removed.

In FIG. 4, the lamp plug assembly is shown in a correct rotational orientation so as to be linearly inserted with its tab 30 first along its axial length through the front surface of the panel 150 and into the aperture 151. In the proper alignment, the lugs 11 and 12 are aligned with the notches 152 and 160 and the edges of the tab 30 are aligned with notches 170 and 180.

As can be seen in FIG. 5, the lamp socket assembly is inserted through the front of the panel 150 and lugs 11 and 12 have caused the exposed conductors 252 and 262 to be wiped into the notches 152 and 160. During insertion, the outer edge of the resilient arms 22 and 23 of the locking means 20 were cammed against the inner most edge of the stop surfaces 158 and 168 of the notches 152 and 160.

FIG. 6 illustrates the rear view of the panel 150 with the resilient arm 23 positioned so that its locking end 27 abuts the locking surface 167. When the locking edges 28 and 27 on the resilient arms 22 and 23 were inserted past the recessed stop surfaces, they returned to their normal positions to abut the rear locking surfaces 155 (FIG. 2) and 167 opposite the stop surfaces 158 and 168. Since the limiting surfaces 17 and 18 of the lugs 11 and 12 are also abutting the stop surfaces 168 and 158 respectively, the lamp plug assembly is securely retained within the aperture 151.

Figure 8:
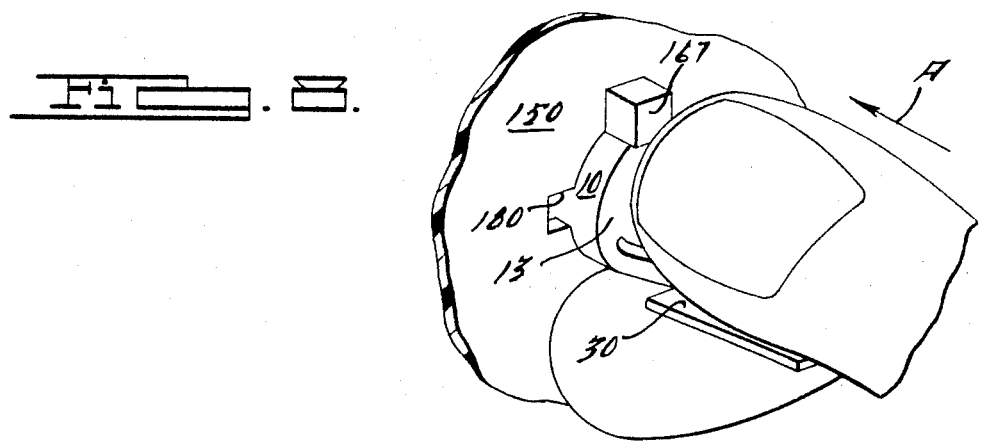
FIG. 8 represents the second step involved in removing the lamp socket assembly from the rear of the rigid support panel.
Figure 9:
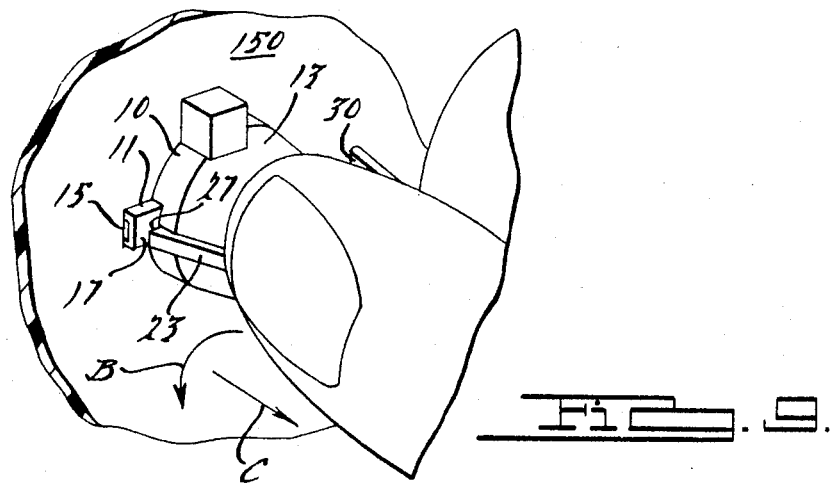
FIG. 9 illustrates the rotation and withdrawal steps used to remove the lamp socket assembly from the rear of the rigid support panel.

In utilizing the present invention, it is now possible to complete the assembly of a display panel even in a configuration which would prevent ready access for replacement of a burned out lamp from the front surface of the panel. In this case, access for removal and replacement service may be made from the back surface of the panel 150 by utilizing the method steps illustrated in FIGS. 7-9. In FIG. 7, the first step of removing the lamp socket assembly from the aperture 151 of the panel 150 is shown. The tab 30 is gripped between the fingers and the resilient arms 22 and 23 of the locking means 20 are compressed until the locking surfaces 27 and 28 are below the edge of the locking surfaces 167 and 155. Subsequently, as shown in FIG. 8, the lamp plug assembly is pushed forward in a direction opposite its original insertion direction until the lugs 11 and 12 have cleared the front surface of the panel 150. At that time, as shown in FIG. 9, the lamp plug assembly is continued to be gripped by the tap 30 and rotated 90° in either direction until the lugs 11 and 12 are aligned with slot 170 and 180. Upon reaching such rotational alignment, the lamp plug assembly may be withdrawn from the rear side of the panel 150 for replacement or inspection.

In order to reinsert the lamp socket assembly or its replacement, steps shown in FIGS. 7, 8 and 9 are reversed and completed when the lamp plug assembly is pulled itno its retain position as shown in FIG. 7.

It will be apparent that many modifications and variations may be implemented without departing from the scope of the novel concept of this invention. Therefore, it is intended by the appended claims to cover all such modifications and variations which fall within the true spirit and scope of the invention.

I claim:

1. A lamp socket support panel having a defined first surface onto which a flexible printed circuit panel is mounted, a second surface that is substantially parallel to the first surface and at least one aperture formed between said surfaces to receive a lamp socket assembly axially inserted from the first surface side of said panel and to interact with said lamp socket assembly to releasably retain said socket assembly against axial removal in either direction when inserted in a first rotational configuration and formed to allow said lamp socket to pass through unobstructed when said lamp socket assembly is in a second rotational configuration that is angularly offset with respect to said first configuration and wherein said aperture is formed as a circular opening of a slightly larger diameter than the body of the socket assembly intended to be inserted therein and has a plurality of notches spaced about the periphery of the opening, at least one of said notches is open to said first surface side of said panel and closed to said second side to limit the insertion of said socket assembly when in said first rotational configuration, and at least a like number of said notches are open to both said first and second surface sides of said panel to allow passage of said socket assembly when in said second rotational configuration.

2. A lamp socket support panel having a defined first surface onto which a flexible printed circuit panel is mounted, a second surface that is substantially parallel to the first surface and at least one aperture formed between said surfaces to receive a lamp socket assembly axially inserted from the first surface side of said panel and to interact with said lamp socket assembly to releasably retain said socket assembly against axial removal in either direction when inserted in a first rotational configuration and formed to allow said lamp socket to pass through unobstructed when said lamp socket assembly is in a second rotational configuration that is orthogonal to said first configuration and wherein said aperture is formed as a circular opening of a slightly larger diameter than the body of the socket assembly intended to be inserted therein and has first and second pairs of diametrically opposed notches equally spaced about the periphery of the opening, said first pair of notches are open to said first surface side of said panel and closed to said second side, said second pair of notches are open to both said first and second surface sides of said panel.

3. A panel as in claim 2, wherein said flexible printed circuit layer contains a plurality of conductor runs and at least one aperture that corresponds in location to said panel aperture, with a pair of exposed conductors extending towards said panel aperture and overlaying said first pair of notches for wiping thereinto when said socket assembly is inserted into said aperture in its said first rotational configuration.

4. A panel as in claim 3, wherein said first pair of notches have predetermined depth and width dimensions and side walls separated by the width dimension that extend from said first surface to said notch depth, and said exposed conductors on said printed circuit layer are each formed to have a plurality of barbs, on the extreme ends thereof towards the center of the panel aperture that are wider than the width dimension on each of the first pair of notches to provide retrorse contact against the sidewalls thereof when said exposed conductors are wiped into said first pair of notches.

5. A panel as in claim 4, wherein said first pair of notches each have a stop surface recessed with respect to the opening in the first surface of said panel to limit the depth of said socket assembly may be inserted therein.

* * * * *